United States Patent
Kato et al.

(10) Patent No.: US 6,306,764 B1
(45) Date of Patent: Oct. 23, 2001

(54) BATCH TYPE HEAT-TREATING METHOD

(75) Inventors: Hitoshi Kato, Kitakami; Takako Sano, Esashi; Yukio Yamamoto, Hanamaki; Hiroyuki Kikuchi, Esashi, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/532,901

(22) Filed: Mar. 22, 2000

(30) Foreign Application Priority Data

Mar. 23, 1999 (JP) .................................................. 11-077169
Jan. 21, 2000 (JP) .................................................. 12-013531

(51) Int. Cl.$^7$ .................................................. H01L 21/44

(52) U.S. Cl. .......................... 438/660; 438/907; 438/758

(58) Field of Search .................................... 438/660, 907, 438/782, 758

(56) References Cited

U.S. PATENT DOCUMENTS 5,112,641 * 5/1992 Harada et al. .
5,478,397 * 12/1995 Shibata et al. .

\* cited by examiner

*Primary Examiner*—Caridad Everhart
(74) *Attorney, Agent, or Firm*—Oblon, Spivak, McClelland, Maier & Neustadt, P.C.

(57) ABSTRACT

In a batch type vertical heat-treating method, first, product wafers and dummy wafers are set to be stacked on an upstream side of a flow of a process gas, in heat treatment, within main holding positions of a holder. The dummy substrates are set more downstream of the process gas than the product wafers. The product wafers and the dummy wafers are set in the holder in a total number smaller than a total number of the main holding positions corresponding to a maximum number of wafers that can be held by the holder, and the holder is in a partially loaded state. The partially loaded holder is loaded in a process vessel, and the product wafers are processed in the process vessel.

18 Claims, 11 Drawing Sheets

| SET STATE | PROCESS OF 100 WAFERS STACKED ON LOWERMOST SIDE | PROCESS OF 100 WAFERS STACKED ON UPPERMOST SIDE | PROCESS OF 100 WAFERS STACKED ON MIDDLE SIDE | PROCESS OF 150 FULL-LOADED WAFERS |
|---|---|---|---|---|
| AVERAGE FILM THICKNESS | 151.24nm | 170.57nm | 162.90nm | 152.27nm |
| TOP | 170.99nm | 168.53nm | 179.65nm | 152.09nm (TOP) |
| CENTER | 146.33nm | 172.06nm | 158.93nm | 152.40nm (CTR) |
| BOTTOM | 144.52nm | 167.07nm | 157.12nm | 153.23nm (BTM) |
| AVERAGE PLANAR UNIFORMITY | ±2.31% | ±3.08% | ±2.52% | ±2.40% |
| TOP | ±3.04% | ±3.32% | ±2.96% | ±3.00% (TOP) |
| CENTER | ±2.48% | ±2.76% | ±2.54% | ±2.41% (CTR) |
| BOTTOM | ±1.62% | ±3.91% | ±1.91% | ±1.71% (BTM) |
| SURFACE-TO-SURFACE UNIFORMITY | ±8.75% | ±2.16% | ±6.92% | ±0.77% |
| FILM DEPOSITION RATE | 2.19nm/min | 2.47nm/min | 2.36nm/min | 2.14nm/min |

F I G. 3

| SET STATE | PROCESS OF 100 WAFERS STACKED ON LOWERMOST SIDE +5DW | PROCESS OF 100 WAFERS STACKED ON LOWERMOST SIDE | PROCESS OF 150 FULL-LOADED WAFERS |
|---|---|---|---|
| FILM THICKNESS OF TOP WAFER | 147.34nm | 170.99nm | 152.27nm (TOP) |
| FILM THICKNESS UNIFORMITY OF TOP WAFER | ±2.00% | ±3.04% | ±3.00% (TOP) |
| SURFACE-TO-SURFACE UNIFORMITY | ±2.37% | ±8.75% | ±0.77% |

FIG. 5

| NUMBER OF WAFERS TO BE PROCESSED | TEMPERATURE (°C) | | | | | SURFACE-TO-SURFACE UNIFORMITY [±%] | FILM DEPOSITION RATE [nm/min] | REPRO-DUCIBILITY [%] |
|---|---|---|---|---|---|---|---|---|
| | TOP | C-T | CTR | C-B | BTM | | | |
| 150 (REFERENCE) | 774 | 771.5 | 760 | 752 | 732 | 0.77 | 2.14 | 0 |
| | | ↓(-7°C) | | | | | | |
| 100 | 774 | 764.5 | 760 | 752 | 732 | 0.58 | 2.11 | -1.44 |
| | | | ↓(-4.5°C) | | | | | |
| 50 | 774 | 771.5 | 755.5 | 752 | 732 | 0.87 | 2.08 | -2.80 |
| | | | ↓(-3.0°C) | | | | | |
| 25 | 774 | 771.5 | 752.5 | 752 | 732 | 0.56 | 2.07 | -3.27 |

FIG. 8

| NUMBER OF WAFERS TO BE PROCESSED | PRESSURE [Torr] | | | FILM DEPOSITION RATE | REPRO-DUCIBILITY |
|---|---|---|---|---|---|
| | EXHAUST SIDE (P1) | CORRECTION VALUE | GAS IN SIDE (P2) | [nm / min] | [%] |
| 150 | 0.250 | 0 | 0.385 | 2.14 | 0 |
| 100 | 0.250 | 0 | 0.368 | 2.09 | -2.34 |
| 50 | 0.250 | 0 | 0.351 | 2.04 | -4.67 |
| 25 | 0.250 | 0 | 0.340 | 2.04 | -4.67 |

FIG. 9A

| NUMBER OF WAFERS TO BE PROCESSED | PRESSURE [Torr] | | | FILM DEPOSITION RATE | REPRO-DUCIBILITY |
|---|---|---|---|---|---|
| | EXHAUST SIDE (P1) | CORRECTION VALUE | GAS IN SIDE (P2) | [nm / min] | [%] |
| 150 | 0.250 | 0 | 0.385 | 2.14 | 0 |
| 100 | 0.270 | 0.02 | 0.385 | 2.12 | -0.93 |
| 50 | 0.290 | 0.04 | 0.385 | 2.12 | -0.93 |
| 25 | 0.300 | 0.05 | 0.385 | 2.16 | +0.93 |

FIG. 9B

BATCH TYPE HEAT-TREATING METHOD

CROSS-REFERENCE TO RELATED APPLICATIONS

This application is based upon and claims the benefit of priority from the prior Japanese Patent Applications No. 11-077169, filed Mar. 23, 1999; and No. 2000-013531, filed Jan. 21, 2000, the entire contents of which are incorporated herein by reference.

BACKGROUND OF THE INVENTION

The present invention relates to a batch type heat-treating method of heat-treating a large number of target substrates, e.g., semiconductor wafers, at once as in a vertical furnace or a lateral furnace.

Generally, as a processing apparatus for performing heat treatment, e.g., film deposition, oxidation, diffusion, or the like for a large number of semiconductor wafers at once, a batch type heat-treating apparatus such as a lateral furnace or a vertical furnace is known.

FIG. 11 is a schematic view showing the arrangement of a general batch type heat-treating apparatus. This batch type heat-treating apparatus 2 has a double tube structured process vessel 8 comprising an inner tube 4 and outer tube 6. A wafer boat 10 is accommodated in a process space S in the inner tube 4 from below. A large number of product wafers W, e.g., about 150 product wafers W, are placed on the wafer boat 10 in a full-loaded state at predetermined pitches, and are subjected to predetermined heat treatment, e.g., CVD (Chemical Vapor Deposition).

Various types of gases such as film deposition gases are introduced into the process vessel 8 from its lower portion, move upward in the process space S in the inner tube 4 while causing reaction, and are then turned downward and move downward through the space between the inner and outer tubes 4 and 6, to be exhausted to the outside. A heater (not shown) divided into zones is disposed around the process vessel 8. A process pressure is detected by a pressure sensor P1 provided at an exhaust port 12.

The process temperature, pressure, and gas flow rate employed when processing wafers fully loaded on the wafer boat 10 are obtained in accordance with the process purpose in advance. During the process, the process temperature, pressure, gas flow rate, and the like are controlled to match the process conditions. Generally, a plurality of side wafers (which do not become product wafers) for increasing the process reproducibility are placed at the upper and lower sides of the wafer boat 10. Monitor wafers (which do not become product wafers) for confirming the process result lie scattered in the product wafers.

Recently, various types of semiconductor devices are required, and accordingly various types of wafer-heat treatments for small-lot are sometimes needed. For example, when, e.g., 150 wafers must be processed as product wafers, the wafer boat 10 is fully loaded. Sometimes a smaller number of wafers than that, e.g., 100, 50, or 25 wafers, must be heat-treated.

In these cases, if an empty region where no wafer is set is present in the wafer boat 10, the wafer temperature and gas concentration may partially fall into disorder. Then, the wafer planar uniformity, surface-to-surface uniformity, and process rate of heat treatment change to decrease the heat-treating reproducibility, which is not preferable. In order to cope with this problem, the wafer boat 10 is fully loaded by using dummy wafers (which do not become product wafers) in number corresponding to the shortage, and heat treatment is performed with the ordinary process conditions for a wafer boat fully loaded with wafers. For example, 170 support grooves are formed in each support pillar 10A of the wafer boat 10 which can process 150 product wafers in a full-loaded state. Thirteen side wafers and 7 monitor wafers can be set respectively by the support grooves.

After a plurality of times of process operation, the dummy wafers are cleaned and are repeatedly used. Finally, the dummy wafers are discarded. Accordingly, use of dummy wafers increases the running cost.

BRIEF SUMMARY OF THE INVENTION

It is an object of the present invention to provide a batch type heat-treating method in which the running cost is reduced by decreasing the number of dummy substrates to be employed without degrading the quality of the process.

The present inventors have obtained findings that, even if target substrates, e.g., semiconductor wafers, are loaded in number smaller than that in a full-loaded state, the heat-treating reproducibility can be maintained at high level by appropriately elaborating the position to set the product wafers, the position to set the dummy wafers, the process temperature, and the like, and reached the present invention.

According to a first aspect of the present invention, there is provided a heat-treating method of accommodating, in a process vessel, a holder which holds a plurality of target substrates apart from each other, and subjecting the target substrates to heat treatment at once while flowing a process gas in the process vessel in a direction along which the target substrates are arranged, comprising:

setting the target substrates and dummy substrates to be stacked on an upstream side of a flow of the process gas, in the heat treatment, within main holding positions of the holder where the target substrates are to be set, the dummy substrates being set more downstream of the process gas than the target substrates, the target substrates and the dummy substrates being set in the holder in a total number smaller than a total number of the main holding positions corresponding to a maximum number of wafers that can be held by the holder, and thus the holder being in a partially loaded state; and transferring into the process vessel the holder in the partially loaded state, and subjecting the target substrates to the heat treatment in the process vessel.

According to a second aspect of the present invention, there is provided a processing method in a vertical heat-treating apparatus for subjecting a plurality of target substrates having substantially the same size to heat treatment at once, wherein the apparatus comprises
a hermetic process vessel for housing the target substrates,
a holder for holding the target substrates in the process vessel to be stacked with gaps thereamong, the holder having at least a (K+M+N)-number of main holding levels for respectively holding the target substrates (K, M, and N are integers of not less than 2),
a supply mechanism having a supply port which opens to the process vessel to supply a process gas into the process vessel,
a heating mechanism for heating an internal atmosphere in the process vessel, and
an exhaust mechanism having an exhaust port which opens to the process vessel to exhaust the process vessel, a process gas from the supply port to the exhaust port flowing in a direction along which the target substrates are arranged, the method comprising:
  setting a K-number of target substrates in the holder, the K-number of target substrates being set at a K-number of main holding levels, among the (K+M+N)-number of main holding levels, that are closest to the supply port in the heat treatment;
  setting, in the holder, an M-number of dummy substrates having substantially the same size as that of the target substrates, the M-number of dummy substrates being set at an M-number of main holding levels, among a (M+N)-number of main holding levels at which the K-number of target substrates are not held, that are closest to the supply port in the heat treatment;
  transferring into the process vessel the holder in a partially loaded state where a (K+M)-number of main holding levels hold the K-number of target substrates and the M-number of dummy substrates, and an N-number of main holding levels are empty; and
  heating the holder in the partially loaded state in the process vessel and subjecting the K-number of target substrates to the heat treatment while flowing the process gas in the process vessel from the supply port toward the exhaust port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a table showing the position to set the product wafers in a wafer boat, and the state of film thickness;

FIG. 5 is a table for explaining a change in film thickness between a case wherein dummy wafers are used and a case wherein no dummy wafers are used;

FIG. 8 is a table showing the film thickness surface-to-surface uniformity, the film deposition rate, and the reproducibility obtained when preset temperature correction is performed on the basis of the result shown in FIG. 7;

FIGS. 9A and 9B are tables showing the relationship among the second pressure sensor (gas IN side) which detects the pressure in the process space substantially accurately, the first pressure sensor, the film deposition rate, and the reproducibility;

DETAILED DESCRIPTION OF THE INVENTION

Figure 1:
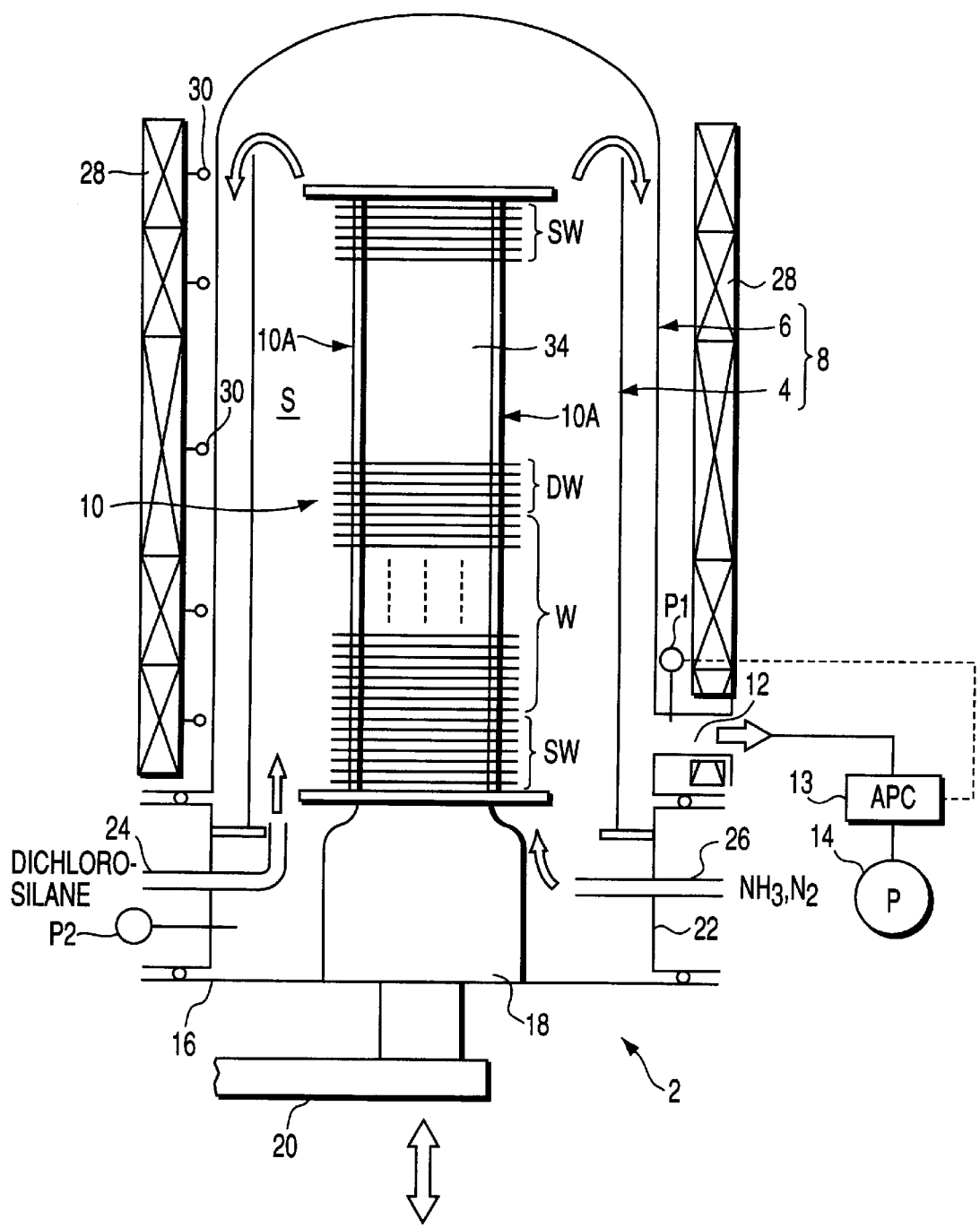
FIG. 1 is a view schematically showing the arrangement of a heat-treating apparatus for practicing a batch type heat-treating method according to the present invention.
Figure 2:
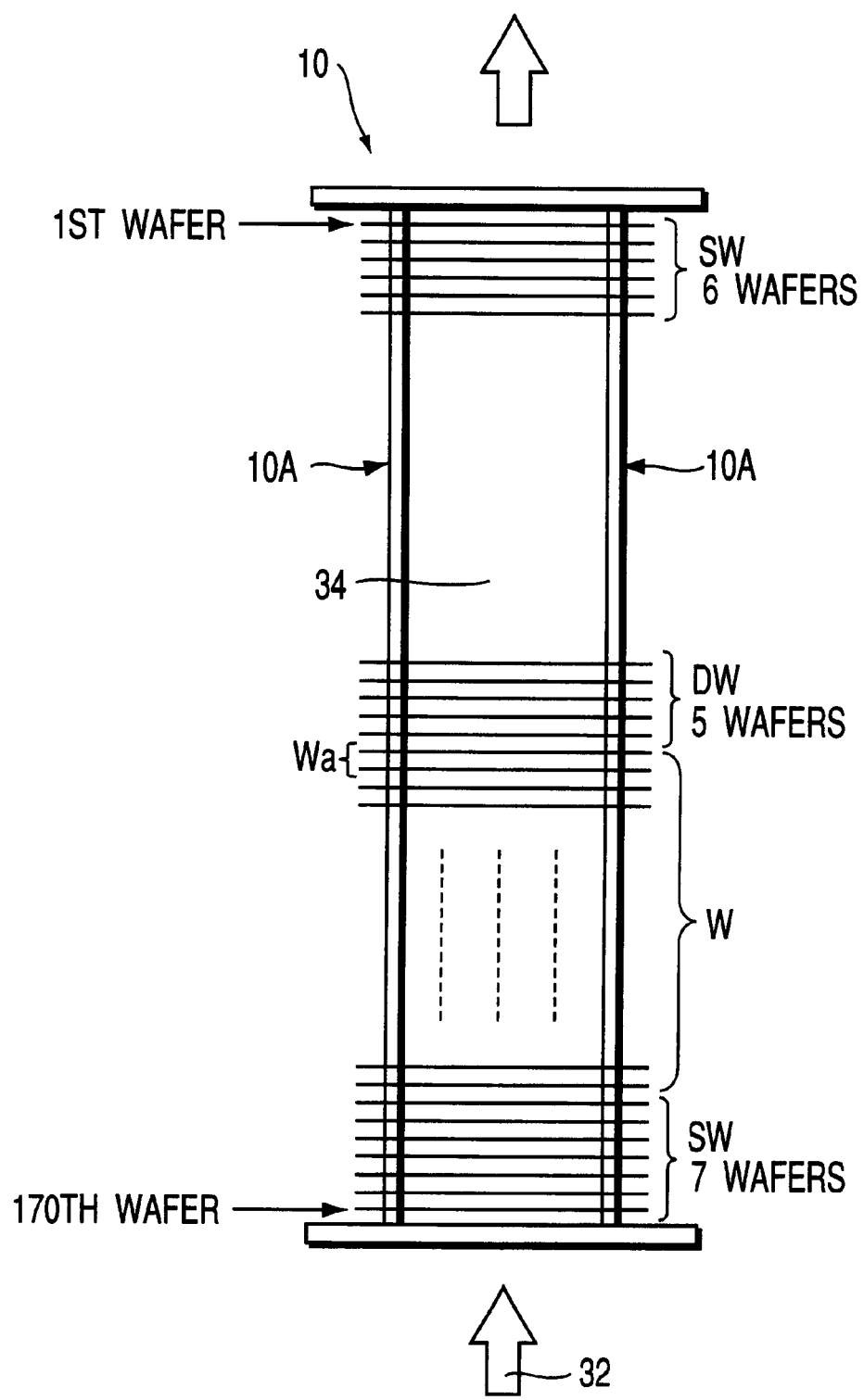
FIG. 2 is a view showing an example wherein product wafers (target substrates) are set in a holder while leaving an empty region.

FIG. 1 is a view schematically showing the arrangement of a heat-treating apparatus for practicing a batch type heat-treating method according to the present invention. FIG. 2 is a view showing an example wherein product wafers (target substrates) are set in a holder while leaving an empty region. As an example of heat treatment, a SiN film is formed on a semiconductor wafer by CVD.

Figure 11:
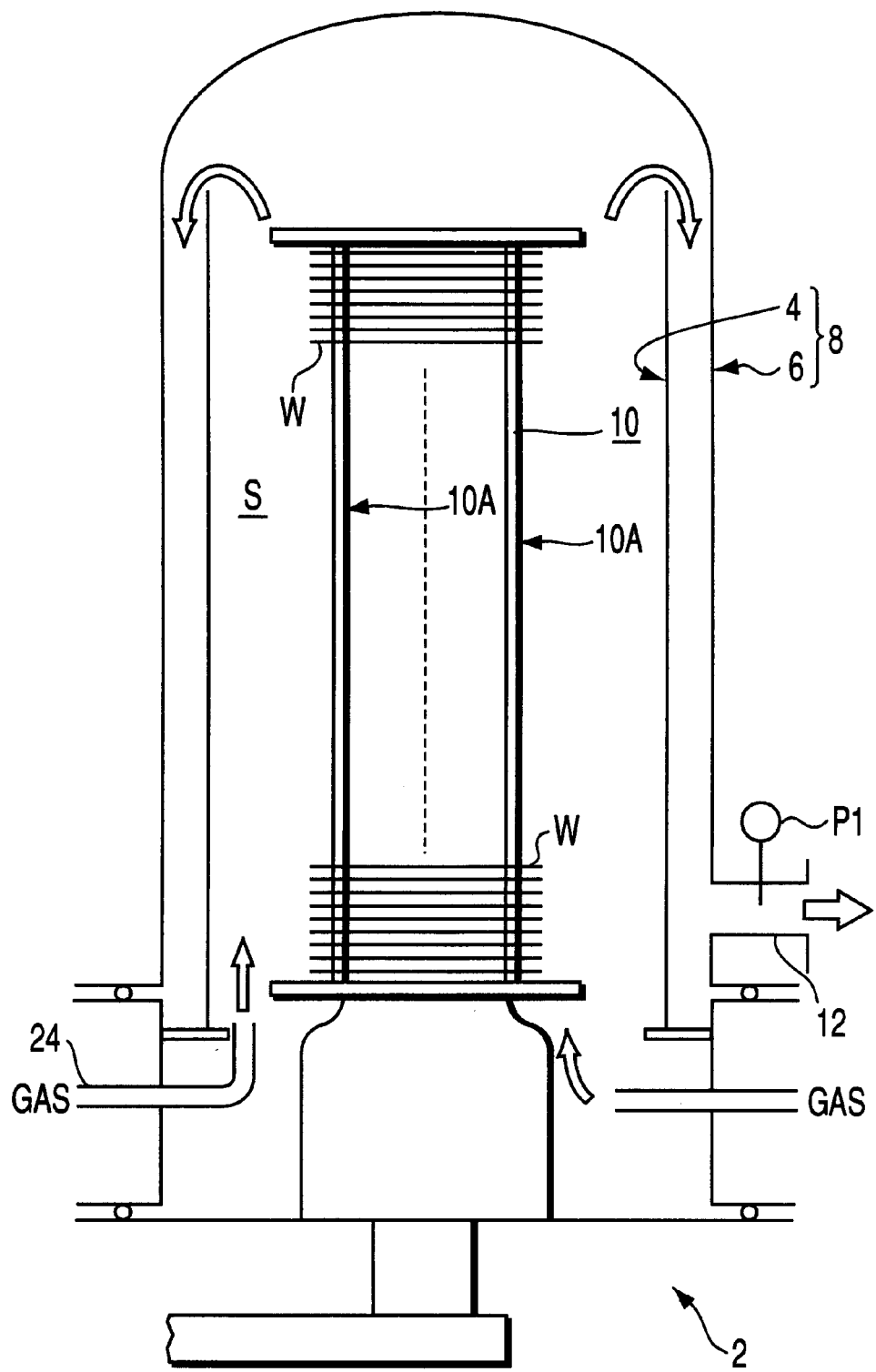
FIG. 11 is a view schematically showing the arrangement of a general batch type heat-treating apparatus.

An example of a batch type heat-treating apparatus which practices the method of the present invention will be described. The structure of a heat-treating apparatus 2 shown in FIG. 1 is the same as that described with reference to FIG. 11. More specifically, this batch type heat-treating apparatus 2 has a double tube structured quartz process vessel 8 comprising an inner tube 4 and outer tube 6. A quartz wafer boat 10 serving as a holder is accommodated in a process space S in the inner tube 4. The wafer boat 10 is placed on a lid 16, which opens/closes the lower portion of the process vessel 8, through a heat insulating cylinder 18, and is detachably set in the process vessel 8 from below by a vertically movable elevator 20. A manifold 22 made of, e.g., stainless steel, is bonded to the opening at the lower end of the process vessel 8. A first nozzle 24 for introducing flow-rate-controlled dichlorosilane as a process gas, and a second nozzle 26 for introducing flow-rate-controlled $NH_3$ as a process gas are disposed in the manifold 22.

After the process gases are supplied from the first and second nozzles 24 and 26, they move upward in the process space S in the inner tube 4, and are then turned downward at the ceiling and flow downward through the space between the inner and outer tubes 4 and 6, to be exhausted to the outside. An exhaust port 12 is disposed in the side wall of the bottom of the outer tube 6. The exhaust port 12 is connected to a vacuum pump 14 through an automatic pressure controller 13. A first pressure sensor P1 for detecting a pressure is connected to the exhaust port 12. To feedback-control the pressure of the process vessel 8, the pressure detected by the pressure sensor P1 is sent to the automatic pressure controller 13. Furthermore, a second pressure sensor P2 for measuring the pressure in a space directly continuous with the process space S is disposed in the manifold 22.

A heater 28 divided into, e.g., five zones, in the direction of height is disposed around the process vessel 8. Temperature sensors 30 such as thermocouples are disposed in the respective zones. Thus, the heater 28 can be temperature-controlled in units of a zone.

Assume that semiconductor wafers smaller in number than that of a full-loaded state are to be processed by using the heat-treating apparatus 2. For example, assume that by using the wafer boat 10 which can process a maximum of 150 (in the full-loaded state) product wafers, 100, 50, or 25 wafers smaller than that are to be processed. In this case, as shown in FIG. 2, product wafers W are supported by the wafer boat 10 to be stacked on the upstream side of a process gas flowing direction 32. Furthermore, a plurality of dummy wafers DW are set immediately downstream of the product wafer group. Since the process gases are supposed to flow upward, the product wafers W are stacked completely on the lowermost side.

Furthermore, about 7 side wafers SW and about 6 side wafers SW are set at the lower end and upper end, respectively, of the wafer boat 10, in the same manner as in the conventional method. The side wafers SW serve to perform temperature compensation of the product wafers located at the upper and lower ends that tend to become thermally non-equilibrium with respect to the product wafers W located at the center. As a result, the heat-treating reproducibility is maintained at high level, as described above.

The dummy wafers DW and side wafers SW do not become product wafers. After a plurality of times of process operation, the dummy wafers DW and side wafers SW are cleaned and are repeatedly used. Note that the size, thickness, material, and the like of the dummy wafers DW and side wafers SW are preferably substantially the same as those of the product wafers. Particularly, the size is preferably the same as that of the product wafers.

For example, 170 support grooves (holding levels) are formed in each support pillar 10A of the wafer boat 10 which can process 150 product wafers in the full-loaded state, as described above. A total of 13 side wafers at the lower end and upper end, and a total of 7 monitor wafers can be set by the holding levels.

When the wafers are stacked on the lowermost side in the above manner, a non-set region 34 where no wafers are set is formed in the wafer boat 10.

In this case, the temperature of the product wafers located in the vicinity of the most downstream side of the process gases, i.e., the temperature of a plurality of product wafers Wa located at the boundary between the dummy wafers DW and product wafers W in FIG. 2, tends to increase, as will be described later. For this reason, the preset temperature of a zone immediately downstream of the product wafers Wa is set lower than the process temperature (reference temperature) in the wafer full-loaded state by several degrees, e.g., by about 1° C. to 8° C. The smaller the number of product wafers W to be processed, the lower the temperature of the zone immediately downstream of the most-downstream product wafer Wa. As a result, film deposition in the product wafer located in the vicinity of the most downstream side is suppressed, so that the surface-to-surface uniformity of the film thickness can be further improved.

Furthermore, the process pressure strongly influences with the film deposition rate. Therefore, the pressure in the process space S in the inner tube 4 is controlled to be precisely equal to the reference pressure in the wafer full-loaded state. More specifically, using the pressure (detected by the pressure sensor P1) on the exhaust port side as the parameter, the pressure in the process space S is set such that the smaller the number of product wafers W to be processed, the higher the pressure at the exhaust port side. Therefore, the film deposition rate can be set substantially equal to that in the reference process state, so that the reproducibility can be further improved.

When heat-treating the wafers in the non-full-loaded state, to maintain the surface-to-surface uniformity, the planar uniformity, and the reproducibility of heat treatment at high level, the position to set the product wafers, the presence/absence and position of dummy wafers, the process pressure, the process temperature, and the like are associated with each other in a complicated manner. The reason why the present inventors reached the conclusion described above will be described in detail.

The position to set the product wafer W in the wafer boat 10 will be examined.

Figure 4A:
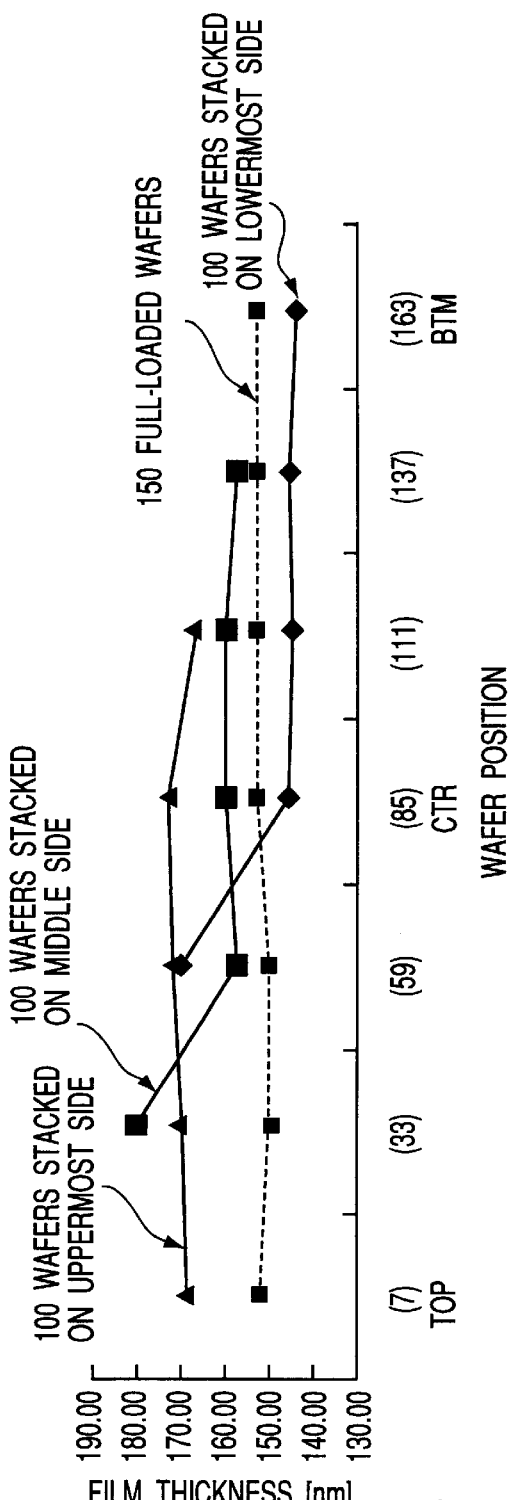
FIGS. 4A and 4B are graphs showing the experimental results according to FIG. 3.
Figure 4B:
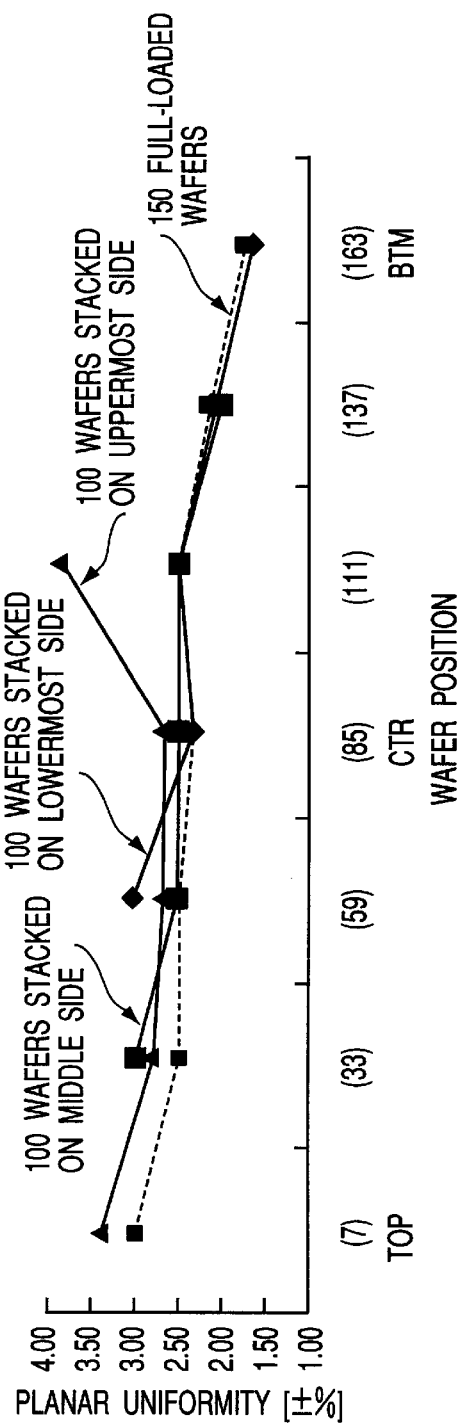

FIG. 3 is a table showing the position to set the product wafers w in the wafer boat, and the state of film thickness, and FIGS. 4A and 4B are graphs showing the experimental results according to FIG. 3. FIG. 3 shows how 100 product wafers W are set when they are to be processed. To measure the film thickness, the film thicknesses of five monitor wafers lying scattered in the product wafers at appropriate intervals are measured. FIG. 3 also shows, as a reference, the result obtained from a process of 150 full-load product wafers, wherein 150 product wafers are set and heat-treated. In this case, seven monitor wafers are used. Predetermined numbers of side wafers SW are set at the upper and lower ends of the wafer boat 10, as described above.

More specifically, in FIG. 3, a process of 100 wafers stacked on the lowermost side indicates a state wherein 100 product wafers W are set to be concentrated on the lower portion of the wafer boat 10. A process of 100 wafers stacked on the uppermost side indicates a state wherein 100 product wafers W are set to be concentrated on the upper portion of the wafer boat 10. A process of 100 wafers stacked on the middle side indicates a state wherein 100 wafers are set to be concentrated on the central portion of the wafer boat 10. In FIG. 3, "empty" refers to a non-set region where no wafers are set.

FIG. 3 shows the film thicknesses of the respective monitor wafers, their average, the film thickness planar uniformities of the respective monitor wafers and their average, and the surface-to-surface uniformity and the film deposition rate of the respective monitor wafers. In FIG. 3, the values of the "top" wafer located at the upper portion of the product wafer group, the "center" wafer located at substantially the center of the product wafer group, and the "bottom" wafer located at the lower portion of the product wafer group, of the 5 monitor wafers, are shown as representative values.

The process conditions are as follows. Eight-inch wafers were used. The process pressure was 0.25 Torr. The process temperature was 760° C. (tilt temperature; this will be described later). As the process gases, dichlorosilane gas and $NH_3$ gas were supplied at 100 sccm and 1,000 sccm, respectively. As the inert gas, $N_2$ gas was supplied at 50 sccm. These process conditions were common in the following respective processes.

As is apparent from FIG. 3 and FIGS. 4A and 4B, in the case of a process of 100 wafers stacked on the uppermost side, the film thicknesses and their average, and the film thickness planar uniformities and their average are much larger than those as reference values obtained in the case of a process of fully stacked 150 wafers. This is not preferable.

In the process of 100 wafers stacked on the lowermost side and the process of 100 wafers stacked on the middle side, the film thickness at the top side is abnormally high. In the process of 100 wafers stacked on the lowermost side, the average film thickness is 151.24 nm, which is smaller than 162.90 nm obtained with the process of 100 wafers stacked on the middle side and is closest to 152.27 nm, which is the reference value. In the process of 100 wafers stacked on the lowermost side, the average film thickness planar uniformity is 2.31%, which is much better than 2.52% obtained with the process of 100 wafers stacked on the middle side and 2.40% as the reference value, thus indicating a good result. The numerical values as the uniformity herein indicate degrees of unevenness in the film thickness.

In the process of 100 wafers stacked on the lowermost side and the process of 100 wafers stacked on the middle side, the surface-to-surface uniformity is 8.75% and 6.92%, respectively, which are much lower than 0.77% as the reference value. This is because the film thickness at the top wafer is abnormally large in both processes. Therefore, except for the abnormally large film thickness of the top wafer, it is obvious that the process of 100 wafers stacked on the lowermost side is more excellent than the process of 100 wafers stacked on the middle side in terms of heat-treating uniformity and sustenance of reproducibility.

Experiments were performed for the process of 50 product wafers and the process of 25 product wafers with the three wafer positioning states described above. Substantially the same results as those described above were obtained. Note that the film deposition rate was 2.08 nm/min in the process of 50 wafers and 2.07 nm/min in the process of 25 wafers, showing some variations from 2.14 nm/min as the reference value. This does not achieve satisfactory film thickness reproducibility. How to improve this will be described later.

How to suppress the film thickness of the top product wafer when dummy wafers are used will be described with reference to FIG. 5 and FIGS. 6A and 6B.

FIG. 5 is a table for explaining a change in film thickness between a case wherein dummy wafers are used and a case wherein no dummy wafers are used. FIGS. 6A and 6B are graphs showing the experimental results according to FIG. 5. Referring to FIG. 5, the process of 100 wafers stacked on the lowermost side +5 DW shows a case wherein 5 dummy wafers DW are set immediately above the group of 100 product wafers. Values obtained with the process of 100 wafers stacked on the lowermost side and the process of 150 fully stacked wafers are equal to those shown in FIG. 3.

Figure 6A:
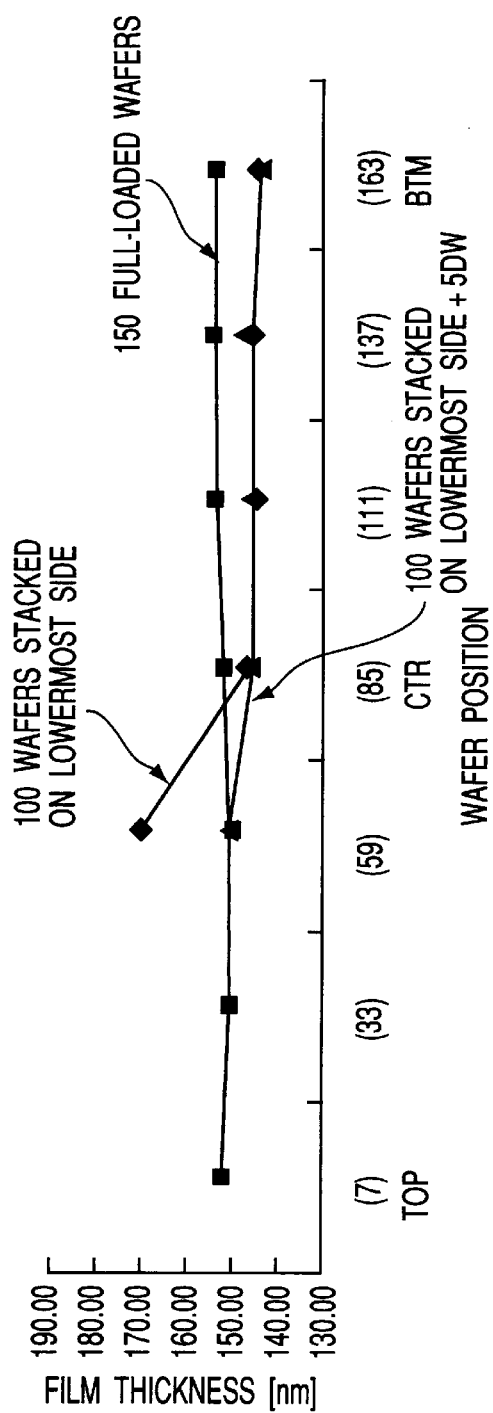
FIGS. 6A and 6B are graphs showing the experimental results according to FIG. 5.
Figure 6B:
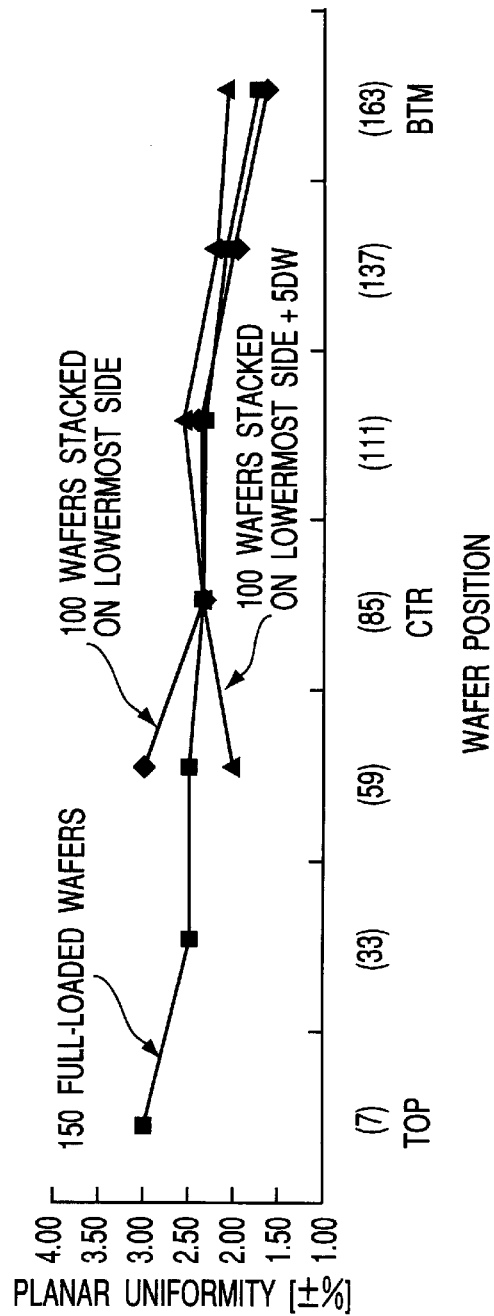

As is apparent from FIG. 5 and FIGS. 6A and 6B, the film thickness of the top wafer is 170.99 nm in the process of 100 wafers stacked on the lowermost side, and is 147.34 nm in the process of 100 wafers stacked on the lowermost side +5 DW, which is rather close to 152.27 nm as the reference value. Furthermore, the film thickness surface-to-surface uniformity in the process of 100 wafers stacked on the lowermost side +5 DW is 2.37%, which is much improved over 8.75% obtained in the process of 100 wafers stacked on the lowermost side. As a result, it is obvious that when a plurality of dummy wafers DW are set immediately above the product wafer group, i.e., on the immediately downstream side of the flowing direction of the film deposition gases, surface-to-surface uniformity of the film thickness can also be improved.

The larger the number of dummy wafers DW to be set, the better. Considering the effect and economical efficiency obtained by setting the dummy wafers DW, the number of dummy wafers DW is appropriately between 1 and 10, and preferably 1 and 6.

The above results will be summarized. When heat-treating product wafers are smaller in number than a constant (full-loaded state), the group of these product wafers W is set to be stacked on the upstream side of the flowing direction of the process gases (they are held to be stacked on the lowermost side in the case shown in FIG. 5). Furthermore, a plurality of dummy wafers DW are set immediately downstream of the product wafer group (immediately above the product wafer group in the case shown in FIG. 5). In this state, film deposition is performed with the process conditions determined by considering the number of stacked product wafers. As a result, the surface-to-surface uniformity and the planar uniformity of the film thickness can be maintained at excellent level to be almost equal to those obtained in the state wherein the wafers are fully stacked.

The process temperature was examined in order to further improve the surface-to-surface uniformity. This will be described with reference to FIGS. 7 and 8.

Figure 7:
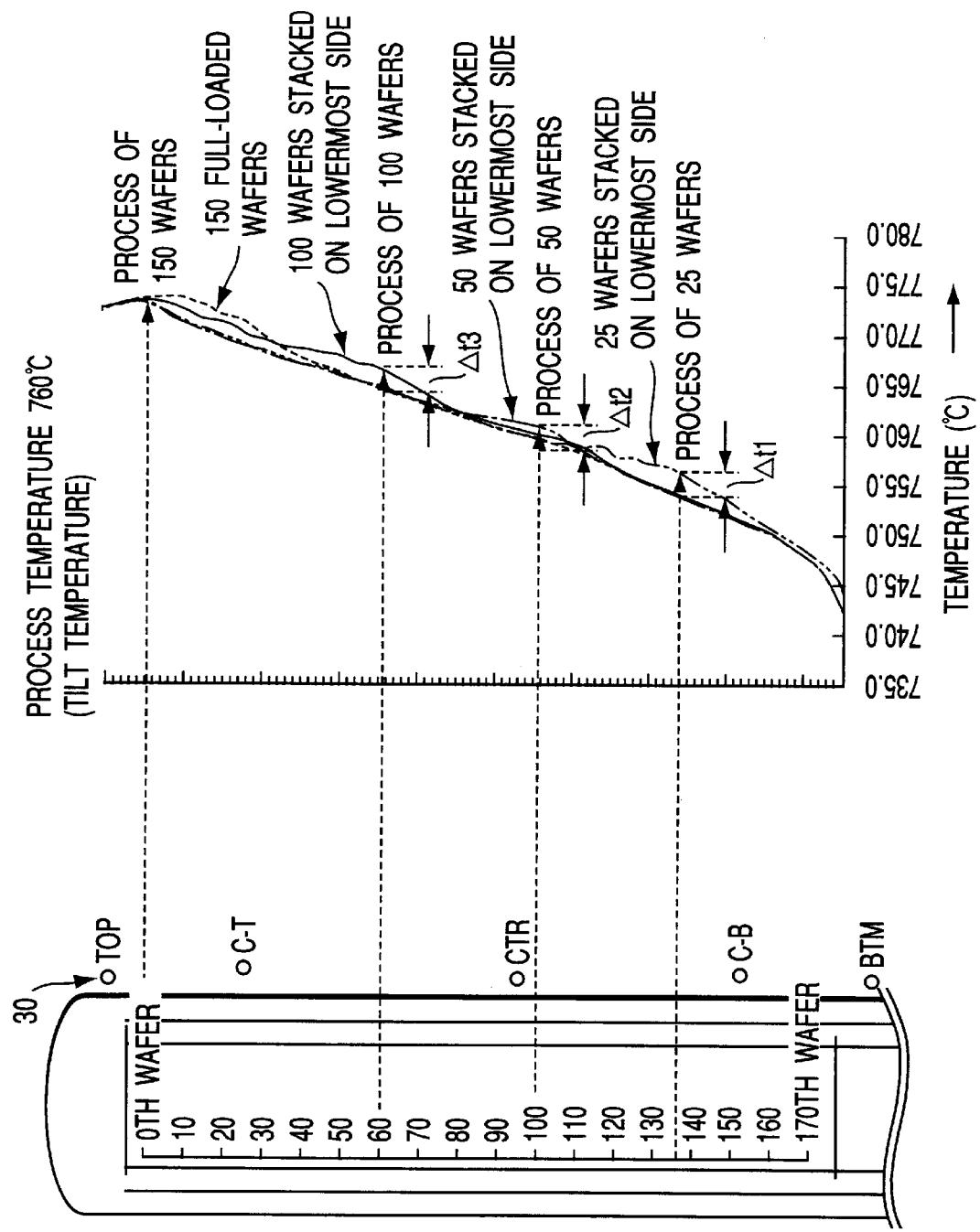
FIG. 7 is a graph showing the relationship between the actual temperature in a process vessel and how the product wafers are set in a tilt temperature controlled state with a process temperature of 760° C.

FIG. 7 is a graph showing the relationship between the actual temperature in a process vessel and how the product wafers are set in a state of tilt temperature control with a process temperature of 760° C. FIG. 8 is a table showing the surface-to-surface uniformity, film deposition rate, and reproducibility of the film thickness when preset zone temperature correction is performed on the basis of the result shown in FIG. 7.

FIG. 7 shows the temperature distributions, in the direction of height, of a wafer boat in which 170 wafers (including side wafers and the like) can be set. In FIG. 7, the temperature distributions are those obtained before preset temperature correction according to the present invention is performed. A broken line, a solid line, an alternate long and short dashed line, and an alternate long and two short dashed line correspond to a state of 150 fully stacked wafers, a state of 100 wafers stacked on the lowermost side, a state of 50 wafers stacked on the lowermost side, and a state of 25 wafers stacked on the lowermost side, respectively.

In this embodiment, tilt temperature control at a process temperature of 760° C. is performed. Tilt temperature control is a kind of temperature control conventionally, generally performed, and mainly aims at improving surface-to-surface uniformity and the like of the film thickness. More specifically, in this temperature control method, the temperature curve is tilted to have a gradient such that the temperature gradually increases, with reference to the process temperature of 760° C., from the upstream side to the downstream side of the flowing direction of the process gases, i.e., from the lower side to the upper side of the wafer boat in the example shown in FIG. 7.

From the graph shown in FIG. 7, it is obvious that, the wafer temperatures near the upper ends (near the most downstream side of the flowing direction of the process gases) of the product wafer groups are higher by $\Delta t1$, $\Delta t2$, and $\Delta t3$ in the state of 25 wafers stacked on the lowermost side, the state of 50 wafers stacked on the lowermost side, and the state of 100 wafers stacked on the lowermost side, respectively, with reference to the preset value (control target temperature) obtained in the state of 150 fully stacked wafers. $\Delta t1$ to $\Delta t3$ fall within the range of about 1° C. to 8° C. Since the temperature is slightly high in this manner, reaction at this portion is promoted accordingly, and the film deposition rate for a product wafer located at this portion becomes undesirably high.

To prevent this, by using the heater which can be temperature-controlled in units of a zone, the temperature at only the corresponding portion described above is set to be lower than the reference temperature (obtained in the full-loaded state) by several 0° C., e.g., by 1° C. to 8° C. The smaller the number of product wafers to be processed, the lower the temperature of a zone immediately downstream of the product wafers. When this preset temperature correction is performed, a smooth linear tilt temperature change occurs for the product wafers.

FIG. 8 shows results obtained when this preset temperature correction is performed. In FIG. 8, TOP, C-T, CTR, C-B, and BTM respectively correspond to thermocouples arranged in FIG. 7. As shown in FIG. 8, in the process of 100 wafers stacked on the lowermost side, preset temperature correction is performed such that the temperature of C-T becomes lower than the reference value (71.5° C.) by 7° C. In the process of 50 wafers stacked on the lowermost side, preset temperature correction is performed such that the temperature of CTR becomes lower than the reference value (760° C.) by 4.5° C. In the process of 25 wafers stacked on the lowermost side, preset temperature correction is performed such that the temperature of CTR becomes lower than the reference value (760° C.) by 7.5 (=4.5+3.0)° C. The temperature of CTR is controlled for the process of 25 wafers stacked on the lowermost side as well, because the product wafer located near the upper end of the product wafer group in the process of 25 wafers stacked on the lowermost side is largely influenced by the heater portion of the zone having the thermocouple CTR.

Preset temperature correction is performed as described above. Consequently, surface-to-surface uniformity of the film thickness of each state exhibits a value equivalent to 0.77%, which is the reference value, or a value smaller than that, thus showing a good result. Note that the film deposition rate varies more or less from 2.14 nm/min as the reference value, leading to some degradation in reproducibility in each film deposition process.

In order to further improve the reproducibility, the process pressure that largely influences the film deposition rate was examined. The obtained result will be described with reference to FIGS. 9A and 9B.

As described above, the pressure in the process space S is feedback-controlled by sending the detection pressure obtained by the pressure sensor P1 at the exhaust port 12 to the automatic pressure controller 13. This control is based on an assumption that if the detection pressure value of the pressure sensor P1 maintains a predetermined process pressure, the pressure in the process space S would become constant.

When product wafers smaller in number than that (150) in a full-loaded state are to be processed, since the product wafers are stacked on the lowermost side, the non-set region 34 (see FIG. 2) is formed. Accordingly, the conductance in the process vessel 8 changes. Through experiments, it was found that the pressure in the process space S varied, depending on the number of product wafers to be processed, by a value corresponding to the variations in the conductance. In other words, even if the pressure in the process space S is controlled to be constant by using the detection value obtained by the pressure sensor P1 at the exhaust port 12, the smaller the number of product wafers, the lower the actual pressure in the process space S.

FIG. 9A indicates this state and shows the relationship between the second pressure (gas IN side) P2 that detects the pressure in the process space substantially accurately and the first pressure sensor P1. As shown in FIG. 9A, even when the detection value of the first pressure sensor P1 provided to the exhaust port 12 is maintained at a constant value of 0.250 Torr, the smaller the number of product wafers, the more the detection value of the second pressure sensor P2 provided to the gas IN side varies, and decreases. Therefore, the film deposition rate becomes lower than 2.14 nm/min as the reference value. Consequently, the reproducibility also degrades to fall within the range of 2.34% to 4.67%.

To solve this problem, the preset pressure of the first pressure sensor P1 is corrected such that the pressure in the process space S becomes constant regardless of a change in number of product wafers to be processed. More specifically, the preset pressure of the pressure sensor P1 is set such that the smaller the number of product wafers to be processed, the higher the pressure (detected by the pressure sensor P1) on the exhaust port side. As a result, degradation in film deposition rate and reproducibility can be prevented.

The pressure in the process space S can be controlled by employing the detection value of the second pressure sensor P2 provided to the gas IN side as the index. FIG. 9B shows the experimental results obtained when the detection value of the second pressure sensor P2 is employed as the index. As shown in FIG. 9B, if the detection value of the second pressure sensor P2 on the gas IN side is controlled at constant 0.385 Torr regardless of how the wafers are set (the detection value of the pressure sensor P1 naturally varies), the film deposition rate does not vary very much. Therefore, the reproducibility becomes about 0.93% and can thus be suppressed within 1%, showing a good result. In other words, when pressure control is performed on the basis of the detection value of the first pressure sensor P1, it suffices if it is done such that the pressure becomes higher by the correction value according to how the wafers are set.

In this manner, according to this embodiment, when the preset temperature of the zone of the process vessel located more downstream of the process gases than the product wafers is slightly corrected, surface-to-surface uniformity of the film thickness can be further improved. Also, when the pressure in the process space S is controlled by the preset pressure of the exhaust port so as to be precisely equal to the pressure obtained in the full-loaded state, the film deposition rate can be improved to maintain the reproducibility at high level.

Figure 10:
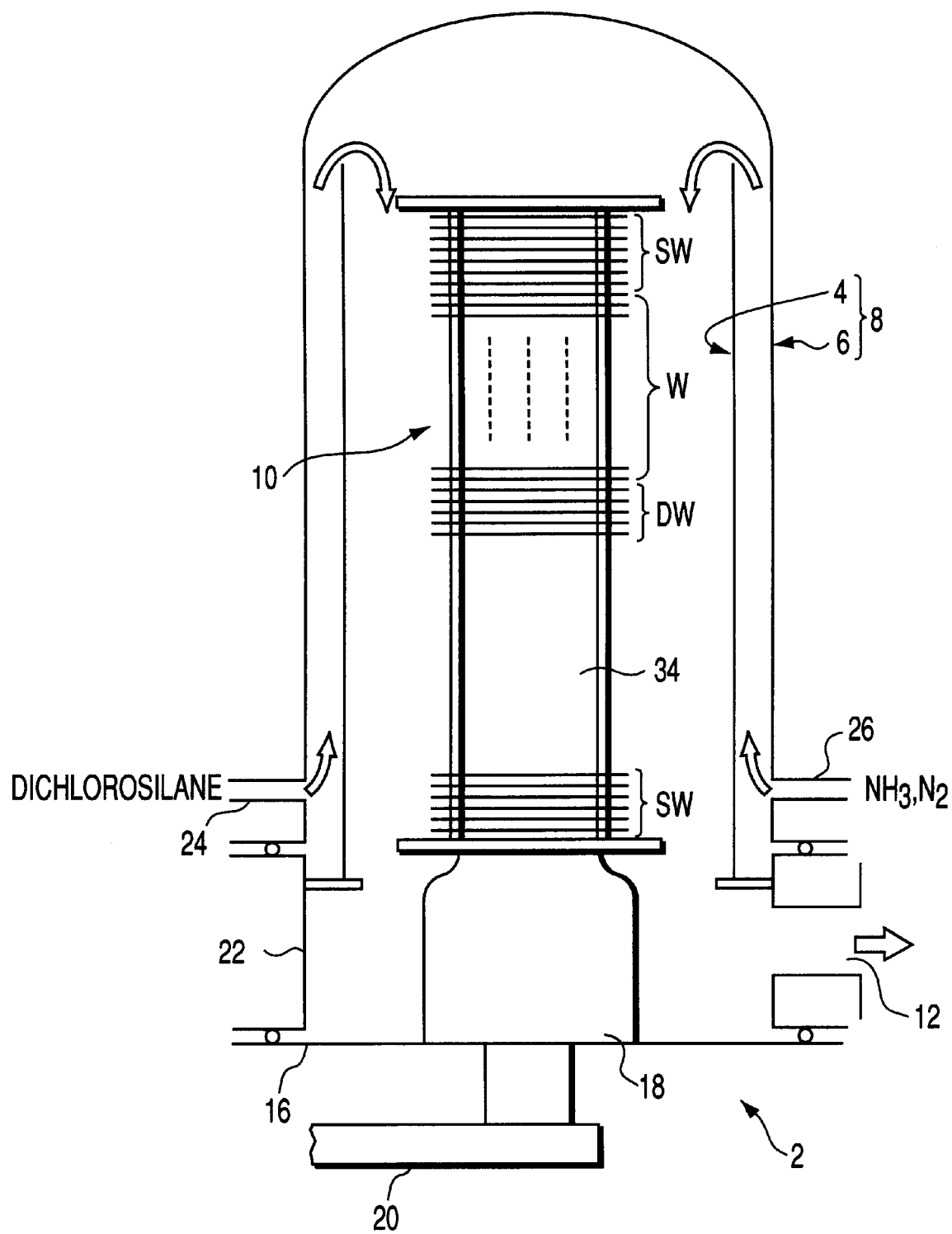
FIG. 10 is a view showing another batch type heat-treating apparatus in which gases flow in a different direction from that of the apparatus in FIG. 1.

In the above embodiment, the process gases flow in the process space S upward from below. However, the present invention is not limited to this. For example, the present invention can also be applied to a heat-treating apparatus as shown in FIG. 10, wherein process gases introduced into a process vessel 8 from below rise through the space between an inner tube 4 and outer tube 6 and are returned at the ceiling downward in a process space S so that they flow downward from above. In this case, product wafers W are stacked on the upstream side in the flowing direction of the process gases, i.e., on the uppermost side, and a non-set region 34 is formed in the lower side of the process space S.

The number of product wafers W to be processed is not limited to 25, 50, or 100, and the number of wafers that fully fill the wafer boat is not limited to 150. The present invention can be applied not only to a heat-treating apparatus having a double tube structure but also to a heat-treating apparatus having a single tube structure. Furthermore, the present invention can be applied not only to deposition of an SiN film but also to deposition of other films, e.g., an $SiO_2$ film. The target substrate is not limited to a semiconductor wafer but can be an LCD substrate, a glass substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat-treating method of accommodating, in a process vessel, a holder which holds a plurality of target substrates apart from each other, and subjecting the target substrates to heat treatment at once while flowing a process gas in said process vessel in a direction along which the target substrates are arranged, comprising:

setting the target substrates and dummy substrates to be stacked on an upstream side of a flow of the process gas, in the heat treatment, within main holding positions of said holder where the target substrates are to be set, the dummy substrates being set more downstream of the process gas than the target substrates, the target substrates and the dummy substrates being set in said holder in a total number smaller than a total number of the main holding positions corresponding to a maximum number of wafers that can be held by said holder, and thus said holder being in a partially loaded state; and transferring into said process vessel said holder in the partially loaded state, and subjecting the target substrates to the heat treatment in said process vessel.

2. The method according to claim 1, wherein the dummy substrates have substantially the same size as that of the target substrates.

3. The method according to claim 1, wherein said holder further has a plurality of additional holding positions, with respect to the main holding positions, on upstream and downstream sides of the flow of the process gas in the heat treatment, the method further comprises, before performing the heat treatment, a step of setting side substrates, which are not used as target substrates, at the additional holding positions, and a plurality of empty main holding positions are present between the dummy substrates and the side substrates on the downstream side.

4. The method according to claim 3, wherein the side substrates have substantially the same size as that of the target substrates.

5. The method according to claim 1, wherein said holder holds the target substrates in said process vessel so as to be stacked vertically with gaps thereamong.

6. The method according to claim 5, wherein in the heat treatment, the process gas is flowed upward from below.

7. The method according to claim 1, wherein the number of dummy substrates set in said holder is 1 to 10.

8. The method according to claim 1, wherein the smaller the number of target substrates set in said holder, the lower a temperature of a heater for heating that region of said process vessel which is located more downstream of the flow of the process gas than the target substrates is set.

9. The method according to claim 1, wherein the smaller the number of target substrates set in said holder, the higher a pressure at an exhaust port of the process vessel in the heat treatment is set.

10. The method according to claim 1, wherein in the heat treatment, a temperature in said process vessel is set to gradually increase from an upstream side toward a downstream side of the flow of the process gas.

11. A processing method in a vertical heat-treating apparatus for subjecting a plurality of target substrates having substantially the same size to heat treatment at once, wherein said apparatus comprises a hermetic process vessel for housing the target substrates, a holder for holding the target substrates in said process vessel to be stacked with gaps thereamong, said holder having at least a (K+M+N)-number of main holding levels for respectively holding the target substrates (K, M, and N are integers of not less than 2), a supply mechanism having a supply port which opens to said process vessel to supply a process gas into said process vessel, a heating mechanism for heating an internal atmosphere in said process vessel, and an exhaust mechanism having an exhaust port which opens to said process vessel to exhaust said process vessel, a process gas from said supply port to said exhaust port flowing in a direction along which the target substrates are arranged, said method comprising:

setting a K-number of target substrates in said holder, the K-number of target substrates being set at a K-number of main holding levels, among said (K+M+N)-number of main holding levels, that are closest to said supply port in the heat treatment;

setting, in said holder, an M-number of dummy substrates having substantially the same size as that of the target substrates, the M-number of dummy substrates being set at an M-number of main holding levels, among a (M+N)-number of main holding levels at which the K-number of target substrates are not held, that are closest to said supply port in the heat treatment;

transferring into said process vessel said holder in a partially loaded state where a (K+M)-number of main holding levels hold the K-number of target substrates and the M-number of dummy substrates, and an N-number of main holding levels are empty; and heating said holder in the partially loaded state in said process vessel and subjecting the K-number of target substrates to the heat treatment while flowing the process gas in said process vessel from said supply port toward said exhaust port.

12. The method according to claim 11, wherein said holder further comprises a P-number of and a Q-number of additional holding levels above and below said main holding levels, respectively, and said method further comprises a step of setting a (P+Q)-number of side substrates, not used as target substrates, at the additional holding levels before performing the heat treatment (where P and Q are integers of not less than 2).

13. The method according to claim 12, wherein the side substrates have substantially the same size as that of the target substrates.

14. The method according to claim 12, wherein in the heat treatment, the process gas is flowed upward from below.

15. The method according to claim 12, wherein the heat treatment is a process of forming a film on the target substrates by CVD.

16. The method according to claim 12, wherein the smaller the number of target substrates set in said holder, the lower a temperature of means for heating that region of said process vessel which is located more downstream of the flow of the process gas than the target substrates is set.

17. The method according to claim 12, wherein the smaller the number of target substrates set in said holder, the higher a pressure at the exhaust port in the heat treatment is set.

18. The method according to claim 12, wherein in the heat treatment, a temperature in said process vessel is set to gradually increase from an upstream side toward a downstream side of the flow of the process gas.

* * * * *